US010854125B2

(12) United States Patent
Tsai et al.

(10) Patent No.: US 10,854,125 B2
(45) Date of Patent: Dec. 1, 2020

(54) DISPLAY PANEL AND DRIVING METHOD

(71) Applicant: AU Optronics Corporation, Hsin-Chu (TW)

(72) Inventors: Yao-Jiun Tsai, Hsin-Chu (TW); Ming-Hung Chuang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/527,110

(22) Filed: Jul. 31, 2019

(65) Prior Publication Data

US 2020/0258436 A1    Aug. 13, 2020

(30) Foreign Application Priority Data

Feb. 13, 2019 (TW) ............................ 108104853 A

(51) Int. Cl.
*G09G 3/20* (2006.01)
*G11C 19/28* (2006.01)

(52) U.S. Cl.
CPC .............. *G09G 3/20* (2013.01); *G11C 19/287* (2013.01); *G09G 2310/0286* (2013.01)

(58) Field of Classification Search
CPC .................. G06G 3/20; G11C 19/287; G09G 2310/0286
See application file for complete search history.

(56) References Cited

U.S. PATENT DOCUMENTS

| 10,062,317 B2* | 8/2018 | Kim ..................... H01L 27/124 |
| 10,360,856 B2* | 7/2019 | Oh ......................... G09G 3/2007 |
| 10,388,228 B2* | 8/2019 | Kim ..................... G09G 3/3225 |
| 2016/0005346 A1* | 1/2016 | Kim ..................... G09G 3/3266 345/690 |
| 2016/0111040 A1* | 4/2016 | Kim ..................... G02F 1/13454 345/698 |
| 2017/0228087 A1* | 8/2017 | Liu ........................ G06F 3/0412 |
| 2017/0337877 A1* | 11/2017 | Kim ..................... G09G 3/3225 |
| 2019/0139474 A1 | 5/2019 | Tsai et al. |
| 2019/0197976 A1* | 6/2019 | Sasaki .................. G09G 3/3648 |
| 2019/0363141 A1* | 11/2019 | Ueno ..................... H05B 33/02 |

FOREIGN PATENT DOCUMENTS

| CN | 1645467 A | 7/2005 |
| CN | 108010949 A | 5/2018 |

* cited by examiner

*Primary Examiner* — Peter D McLoone
(74) *Attorney, Agent, or Firm* — WPAT, PC

(57) ABSTRACT

A driving method, suitable for a display panel. The display panel includes a first display area, a second display area, a first gate driving circuit and a second gate driving circuit. The second display area comprises an opening. The driving method includes outputting a first gate signal to several first gate lines located at the first display area by the first gate driving circuit; outputting the first gate signal to several second gate lines located at the first display area by the second gate driving circuit, wherein the first gate lines and the second gate lines are arranged in an interlaced manner; outputting the first gate signal and a second gate signal to several third gate lines located at the second display area in the interlaced manner by the first gate driving circuit and the second gate driving circuit.

8 Claims, 3 Drawing Sheets

DISPLAY PANEL AND DRIVING METHOD

RELATED APPLICATIONS

This application claims priority to Taiwan Application Serial Number 108104853, filed Feb. 13, 2019, which is herein incorporated by reference.

BACKGROUND

Technical Field

The present disclosure relates to a display panel and a driving method. More particularly, the present disclosure relates to a display panel and a driving method with an opening.

Description of Related Art

At present, smart phone screens are getting bigger and bigger, and without increasing the size of mobile phones, many mobile phone manufacturers use high-resolution display panels with narrow borders or ultra-narrow bezels to increase the proportion of display parts. The display is enlarged. However, limited by the acousto-optic components on the phone (such as lenses, speakers, etc.), the proportion of the rectangular display panel is limited. Thus, a display panel with opening was developed to further increase the display panel's share. However, since the opening part cannot configure the line, the new layout method is proposed to be suitable for the display panel with opening so that the pixels on the display panel can be driven normally.

However, since the display area on both sides of the opening is unilaterally driven, the displayed display pixels are considered to be near-end and the waveforms are close to each other. Because the rest of the display area is single driven in an interlaced manner, the driven pixels are close to each other, and the waveforms will be different, resulting in a boundary phenomenon.

SUMMARY

One aspect of the present disclosure is related to a display panel including a first display area, a second display area, a first gate driving circuit and a second gate driving circuit, several first gate lines, several second gate lines, and several third gate lines. The second display area includes an opening and a first sub-display area, second sub-display area located at two sides of the opening. The first gate driving circuit and a second gate driving circuit are located at two sides of the first display area and the second display area. The several first gate lines are located at the first sub-display area, and the first gate lines are coupled to the first gate driving circuit. The several second gate lines are located at the second sub-display area and are coupled to the second gate driving circuit. The several third gate lines are located at the first display area and are coupled to one of the first gate lines and the second gate lines, and receive a first gate signal from one of the first gate lines and the second gate lines. The first gate driving circuit outputs the first gate signal and a second gate signal to the first gate lines in an interlaced manner. The second gate driving circuit outputs the first gate signal and the second gate signal to the second gate lines in an interlaced manner. A rise time of the second gate signal is longer than a rise time of the first gate signal, and a fall time of the second gate signal is longer than a fall time of the first gate signal.

One aspect of the present disclosure is related to a driving method, suitable for a display panel. The display panel includes a first display area, a second display area, a first gate driving circuit and a second gate driving circuit. The second display area comprises an opening. The driving method includes outputting a first gate signal to several first gate lines located at the first display area by the first gate driving circuit; outputting the first gate signal to several second gate lines located at the first display area by the second gate driving circuit, wherein the first gate lines and the second gate lines are arranged in an interlaced manner; outputting the first gate signal and a second gate signal in an interlaced manner to several third gate lines located at the second display area by the first gate driving circuit and the second gate driving circuit. A rise time of the second gate signal is longer than a rise time of the first gate signal, and a fall time of the second gate signal is longer than a fall time of the first gate signal.

Through the operations of one embodiment described above, by compensating the unilateral driving circuit located at the display area of two sides of the driving opening, so that the unilateral driving waveform is approximated to the near end and far end waveform in an interlaced manner of the one-sided driving circuits located at the display area.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
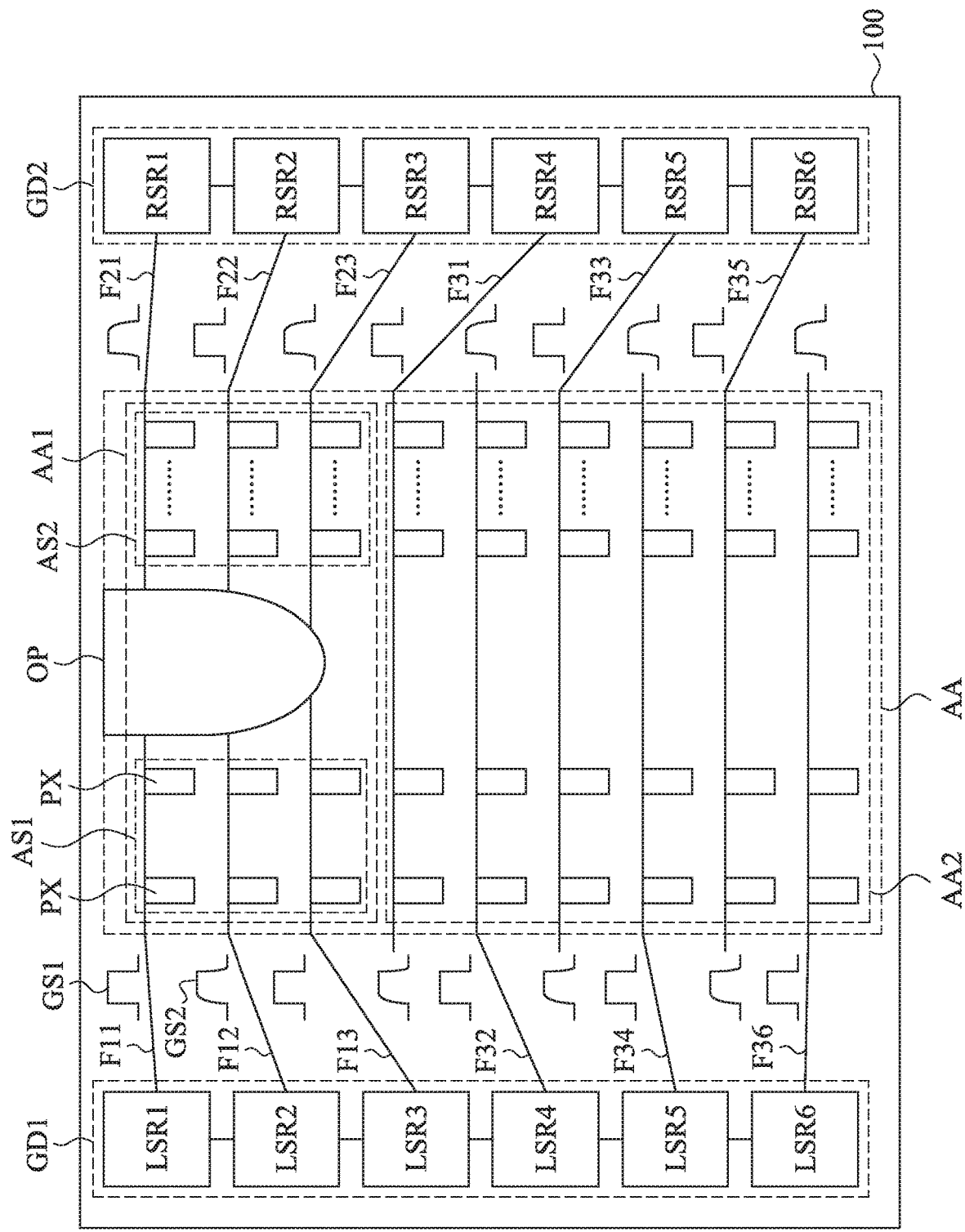
FIG. 1 is a schematic diagram of a display panel in accordance with some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

It will be understood that, in the description herein and throughout the claims that follow, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Moreover, "electrically connect" or "connect" can further refer to the interoperation or interaction between two or more elements.

It will be understood that, in the description herein and throughout the claims that follow, although the terms "first," "second," etc. may be used to describe various elements, these elements should not be limited by these terms. These terms are only used to distinguish one element from another. For example, a first element could be termed a second element, and, similarly, a second element could be termed a first element, without departing from the scope of the embodiments.

It will be understood that, in the description herein and throughout the claims that follow, the terms "comprise" or "comprising," "include" or "including," "have" or "having," "contain" or "containing" and the like used herein are to be understood to be open-ended, i.e., to mean including but not limited to.

It will be understood that, in the description herein and throughout the claims that follow, the phrase "and/or" includes any and all combinations of one or more of the associated listed items.

It will be understood that, in the description herein and throughout the claims that follow, words indicating direction used in the description of the following embodiments, such as "above," "below," "left," "right," "front" and "back," are directions as they relate to the accompanying drawings. Therefore, such words indicating direction are used for illustration and do not limit the present disclosure.

It will be understood that, in the description herein and throughout the claims that follow, unless otherwise defined, all terms (including technical and scientific terms) have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any element in a claim that does not explicitly state "means for" performing a specified function, or "step for" performing a specific function, is not to be interpreted as a "means" or "step" clause as specified in 35 U.S.C. § 112(f). In particular, the use of "step of" in the claims herein is not intended to invoke the provisions of 35 U.S.C. § 112(f).

Reference is made to FIG. 1. FIG. 1 is a schematic diagram of a display panel 100 in accordance with some embodiments of the present disclosure. As illustrated in FIG. 1, the display panel 100 includes a display area AA, a gate driving circuit GD1, GD2. The display area AA includes display areas AA1 and AA2. The display area AA1 includes an opening OP and the sub-display areas AS1 AND AS2 located at two sides of the opening OP. The gate driving circuits GD1 AND GD2 are located at two sides of the display areas AA1 and AA2.

The display panel 100 further includes gate lines F11 to F13 located at the sub-display area AS1, gate lines F21 to F23 located at the sub-display area AS2, gate lines F31 to F36 located at the display area AA2.

In the connection relationship, the gate lines F11 to F13 are coupled to the gate driving circuit GD1, and the gate lines F11 to F13 are coupled to the pixel circuit PX located at the sub-display area AS1. The gate lines F21 to F23 are coupled to the gate driving circuit GD2, and the gate lines F21 to F23 are coupled to the pixel circuit PX located at the sub-display area AS2. The gate lines F31 to F36 are coupled to the gate driving circuits GD1, GD2, and the gate lines F31 to F36 are coupled to the pixel circuit PX located at the display area AA2.

As illustrated in FIG. 1, the gate driving circuit GD1 outputs the gate signals GS1, GS2 to the gate lines F11 to F13 in an interlaced manner. The gate driving circuit GD2 outputs the gate signals GS1, GS2 to the gate lines F21 to F23 in an interlaced manner. The gate driving circuits GD1, GD2 output gate signal GS1 to the gate lines F31 to F36.

In detail, the gate driving circuit GD1 outputs the gate signal GS1 to the gate line F11, the gate driving circuit GD1 outputs the gate signal GS2 to the gate line F12, the gate driving circuit GD1 outputs the gate signal GS1 to the gate line F13. On the other hand, the gate driving circuit GD2 outputs the gate signal GS2 to the gate line F21, the gate driving circuit GD2 outputs the gate signal GS1 to the gate line F22, the gate driving circuit GD2 outputs the gate signal GS2 to the gate line F23.

In the part of the display area AA2, the gate driving circuit GD2 outputs the gate signal GS1 to the gate lines F31, F33, F35, the gate driving circuit GD1 outputs gate signal GS1 to the gate lines F32, F34, F36.

The rise time of the gate signal GS2 is longer than the rise time of the gate signal GS1, and the fall time of the gate signal GS2 is longer than the fall time of the gate signal GS1.

Since the driving method of the display area AA2 is a single drive mode with an interlaced manner. In this situation, the signal received by the near end of the gate lines F31 to F36 is the gate signal GS1. However, when transmitted to the far end of gate lines F31 to F36, the waveform of the gate signal will be distorted, and the signal waveform of the far end of the gate lines F31 to F36 is the waveform of the gate signal GS2. In the embodiments of the present disclosure, in the area of the display area AA1, gate driving circuit GD1, GD2 output gate signals GS1, GS2 to the gate lines F11 to F13 and the gate lines F21 to F23 in an interlaced manner. In this way, the gate signals on the left and right sides of the display area AA1 and AA2 can be made uniform. That is, regardless of locating at the display area AA1 or AA2, the gate signals received on the left and right sides are gate signals GS1, GS2 in an interlaced manner. In this way, the occurrence of crossover phenomenon may be avoided.

In some embodiments, as illustrated in FIG. 1, the gate driving circuit GD1 outputs the gate signal GS1 to the odd-numbered gate lines of the gate lines F11 to F13, the gate driving circuit GD1 outputs the gate signal GS2 to the even-numbered gate lines of the gate lines F11 to F13. On the other hand, the gate driving circuit GD2 outputs the gate signal GS1 to the even-numbered gate lines of the gate lines F21 to F23, the gate driving circuit GD2 outputs the gate signal GS2 to the odd-numbered gate lines of the gate lines F21 to F23.

However, the present disclosure is not limited thereto. In some other embodiments, the gate driving circuit GD1 outputs the gate signal GS1 to the even-numbered gate lines of the gate lines F11 to F13, the gate driving circuit GD1 outputs gate signal GS2 to the even-numbered gate lines of the gate lines F11 to F13. On the other hand, the gate driving circuit GD2 outputs the gate signal GS1 to the even-numbered gate lines of the gate lines F21 to F23, and the gate driving circuit GD2 outputs the gate signal GS2 to the even-numbered gate lines of the gate lines F21 to F23.

In some embodiments, as illustrated in FIG. 1, the gate driving circuit GD1 includes several shift registers LSR1 to LSR6. The gate driving circuit GD2 includes several shift registers RSR1 to RSR6. The shift register LSR1 outputs the gate signal GS1 to the gate line F11, the shift register LSR2 outputs the gate signal GS2 to the gate line F12, and the shift register LSR3 outputs the gate signal GS1 to the gate line F13. On the other side, the shift register RSR1 outputs the gate signal GS2 to the gate line F21, the shift register RSR2 outputs the gate signal GS1 to the gate line F22, and the shift register RSR3 outputs the gate signal GS2 to the gate line F23.

That is, in the gate driving circuit GD1, the shift register LSR1, LSR3 that outputs the gate signal GS1 and the shift register LSR2 that outputs the gate signal GS2 are arranged in an interlaced manner. Similarly, in the gate driving circuit GD2, the shift register RSR2 that outputs the gate signal GS1, and the shift register RSR1, RSR3 that outputs the gate signal GS2 are arranged in an interlaced manner.

Figure 2:
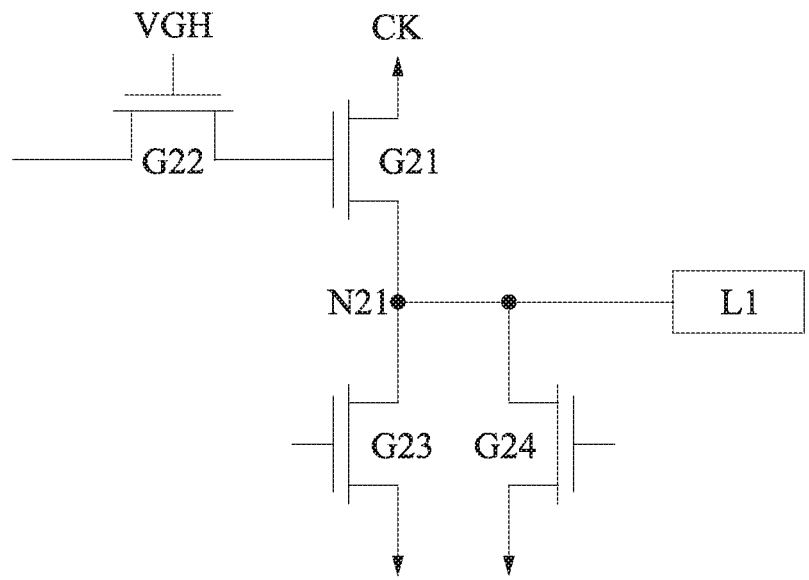
FIG. 2 is a shift register in accordance with some embodiments of the present disclosure.

Reference is made to FIG. 2. FIG. 2 is a shift register 200 in accordance with some embodiments of the present disclosure. As illustrated in FIG. 2, the shift register 200 includes driving transistor G21, the pull-up transistor G22 and the pull-down transistor G23, G24. In the connection relationship, the control terminal of the pull-up transistor G22 is configured to receive the VGH voltage, a terminal of the pull-up transistor G22 and the control terminal of the driving transistor G21 are coupled to each other. A terminal of the driving transistor is configured to receive the clock signal CK. Another terminal of the driving transistor, a terminal of the pull-down transistor G23, a terminal of the pull-down transistor G24, and a terminal of the load L1 are coupled to the node N21. The node N21 is coupled to one of the several gate lines F11 to F13, F21 to F23, and F31 to F36, so as to output the gate signal to the pixel circuit. Furthermore, the node N21 is coupled to the next stage of the shift register, so as to output subordinate signal to the shift register which is in a next stage.

The shift register 200 as illustrated in FIG. 2 may be used to represent the shift registers LSR1 to LSR6, RSR1 to RSR6 as illustrated in FIG. 1. It should be noted that, in the shift registers LSR1 to LSR6, RSR1 to RSR6, the width to length ratio of the channel of the driving transistor G21 of the shift register configured to output the gate signal GS1 is larger than the width to length ratio of the channel of the driving transistor G21 of the shift register configured to output the gate signal GS2. In this way, The rise time of the gate signal GS1 output by the shift register is shorter than the rise time of the gate signal GS2 output by the shift register, and the fall time of the gate signal GS1 output by the shift register is shorter than the fall time of the gate signal GS2 of the shift register output. The rise time of the gate signal GS1 output by the shift register is shorter than the rise time of the gate signal GS2 output by the shift register, and the fall time of the gate signal GS1 output by the shift register is shorter than the fall time of the gate signal GS2 output by the shift register.

Figure 3:
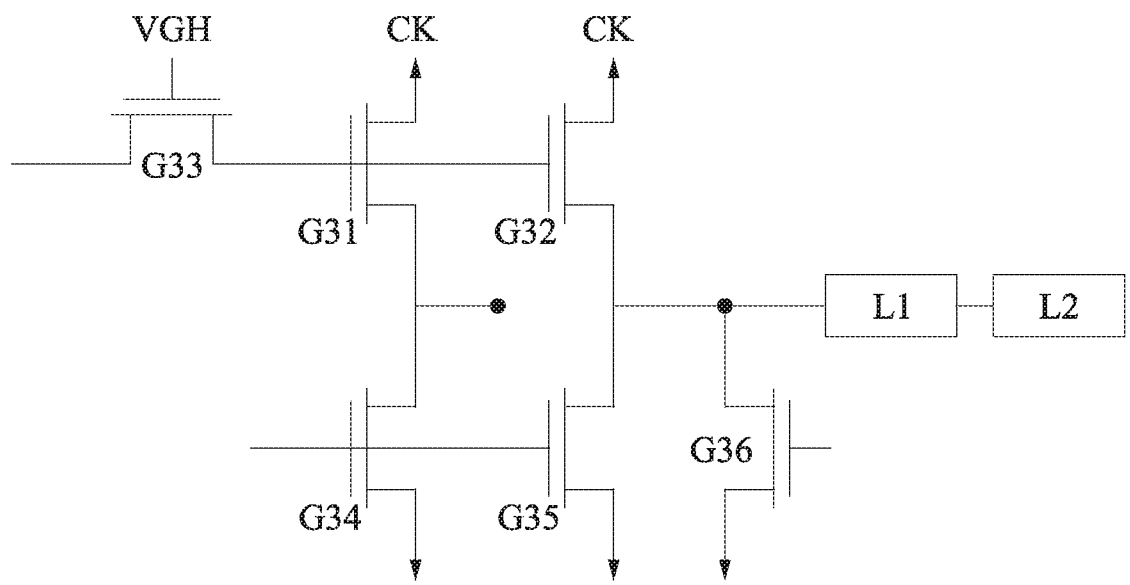
FIG. 3 is a shift register configured to output a gate signal in accordance with some embodiments of the present disclosure.

Reference is made to FIG. 3. FIG. 3 is a shift register 300 configured to output a gate signal in accordance with some embodiments of the present disclosure. As illustrated in FIG. 3, the shift register 300 includes a compensation transistor G31, driving transistor G32, pull-up transistor G33, and the pull-down transistor G34, G35, G36. In the connection relationship, the control terminal of the pull-up transistor G33 is coupled to the voltage VGH, a terminal of the pull-up transistor G33 is coupled to a control terminal of the compensation transistor G31 and the control terminal of the driving transistor G32. That is, the compensation transistor G31 and the driving transistor G32 are series connected. A terminal of the compensation transistor G31 and a terminal of the driving transistor G32 are coupled to the clock signal CK. Another terminal of the compensation transistor G31 is coupled to a terminal of the pull-down transistor G34. Another terminal of the driving transistor G32 is coupled to a terminal of the pull-down transistor G3, a terminal of the pull-down transistor G36 and the load L1. Furthermore, another terminal of the compensation transistor G31 coupled to the shift register of the next stage, and the compensation transistor G31 is configured to output a subordinate signal to the shift register which is in a next stage. Another terminal of the pull-up transistor G32 is coupled to one of the several gate lines F11 to F13, F21 to F23 and F31 to F36, so as to output the gate signal to the pixel circuit.

The shift register 300 as illustrated in FIG. 3 may represent the shift register LSR2, RSR1 and RSR3 that outputs the gate signal GS2 as illustrated in FIG. 1. In some embodiments, the shift registers LSR1, LSR3, RSR2, LSR4 to LSR6, RSR4 to RSR6 that output gate signal GS1 as illustrated in FIG. 1 are represented by the shift register 200 as illustrated in FIG. 2. The shift registers LSR2, RSR1, and RSR2 of signal GS2 are the shift register 300 as shown in FIG. 3. The shift registers LSR1, LSR3, RSR2, LSR4 to LSR6, RSR4 to RSR6 that output gate signal GS1 as illustrated in FIG. 1 are represented by the shift register 200 as illustrated in FIG. 2. The shift registers LSR2, RSR1, and RSR2 that output gate signal GS2 as illustrated in FIG. 1 are represented by the shift register 300 as illustrated in FIG. 3.

In this case, the width to length ratio of the channel of the driving transistor G32, which is configured to output the of the gate signal GS2, of the shift register 300 is larger than the width to length ratio of the channel of the driving transistor G21, which is configured to output the gate signal GS1, of the shift register 200. In this way, the rise time of the gate signal GS1 output by the shift register is shorter than the rise time of the gate signal GS2 output by the shift register, and the fall time of the gate signal GS1 output by the shift register is shorter than the fall time of the gate signal GS2 output by the shift register.

In some embodiments, the sum of the width to length ratio of the channel of the compensation transistor G31 and the width to length ratio of the channel of the driving transistor G32 is equal to the width to length ratio of the channel of the driving transistor G21. In this way, the parasitic capacitance of the shift register 300 that outputs the gate signal GS2 is consistent or similar to the parasitic capacitance of the shift register 200 for outputting the gate signal GS1.

In some embodiments, as illustrated in FIG. 3, the shift register 300 further includes load L2. That is, the load on the gate line of the shift register 300 is larger than the load on the gate line of the shift register 200. The shift register 300 is configured to output the gate signal GS2, and the shift register 200 is configured to output the gate signal GS1. In this way, it is also possible to make the rise time of the gate signal GS1 output by the shift register shorter than the rise time of the gate signal GS2 output by the shift register, and it is also possible to make the fall time of the gate signal GS1 output by the shift register shorter than the fall time of the gate signal GS2 output by the shift register.

Furthermore, in FIG. 3, since the pull-down transistors G34 to G36 are connected in series, the pull-down efficiency of the shift register 300 is better than the pull-down efficiency of the shift register 200.

In the embodiments of FIG. 3, by utilizing the feature that the width to length ratio of the channel of the driving transistor G32 of the shift register 300, configured to output the gate signal GS2, is smaller than the width to length ratio of the channel of the driving transistor G21 of the shift register 200, configured to output the gate signal GS1, so that the rise time of the gate signal GS1 output by the shift register is shorter than the rise time of the gate signal GS2 output by the shift register, and the fall time of the gate signal GS1 output by the shift register is shorter than the fall time of the gate signal GS2 output by the shift register. At the same time, since the reduction of the width to length ratio of the channel of the driving transistor G32 may cause waveform distortion, which causes an error in the output of the subordinate signal. Therefore, by setting the compensation transistor G31, the signal with the same or similar waveform as the gate signal GS1 is output through one end of the compensation transistor G31 to avoid an error in the output of the subordinate signal.

Figure 4:
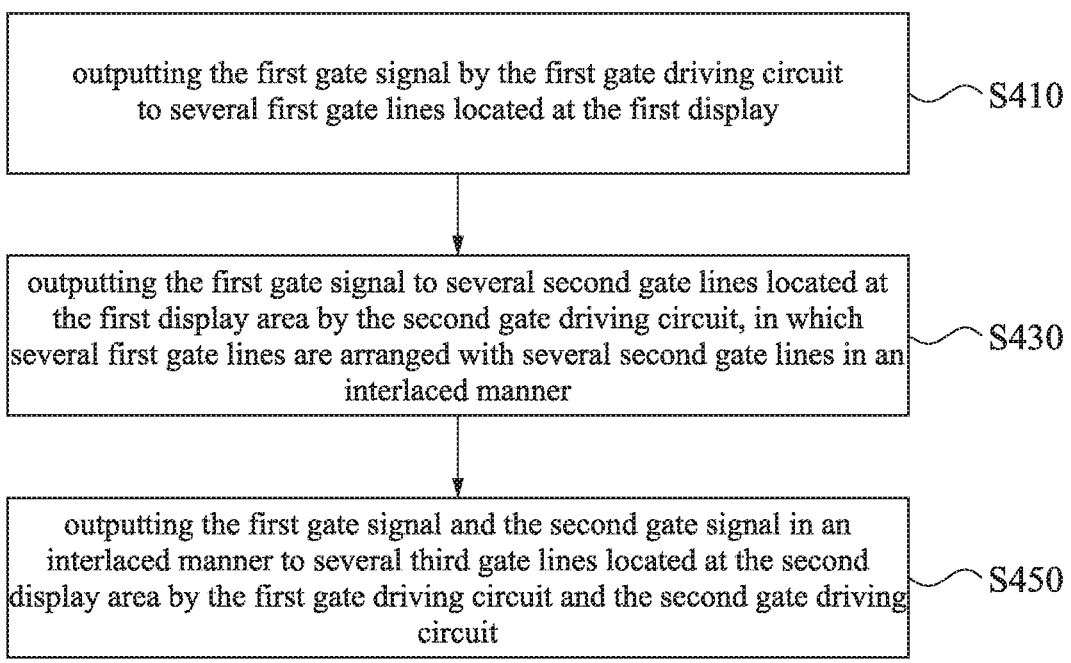
FIG. 4 is a driving method in accordance with some embodiments of the present disclosure.

Reference is made to FIG. 4. FIG. 4 is a driving method 400 in accordance with some embodiments of the present disclosure. The driving method includes operations S410 to S450. For convenience of illustration and description, reference is made to FIG. 1 and FIG. 4.

In operation S410, outputting the first gate signal by the first gate driving circuit to several first gate lines located at the first display. For example, the gate driving circuit GD1 as illustrated in FIG. 1 outputs gate signal GS1 to the gate lines F32, F34, F36 located at the display area AA2.

In operation S430, outputting the first gate signal to several second gate lines located at the first display area by the second gate driving circuit, in which several first gate lines are arranged with several second gate lines in an interlaced manner. For example, the gate driving circuit GD2 as illustrated in FIG. 1 outputs the gate signal GS1 to the gate lines F31, F33, F35 located at the display area AA2. The gate lines F32, F34, F36 and the gate lines F31, F33, F35 are arranged in an interlaced manner.

In operation S450, outputting the first gate signal and the second gate signal in an interlaced manner to several third gate lines located at the second display area by the first gate driving circuit and the second gate driving circuit. For example, the gate driving circuit GD1 as illustrated in FIG. 1 outputs gate signal GS1 to the gate line F12, and the gate driving circuit GD1 as illustrated in FIG. 1 outputs the gate signal GS2 to the gate lines F11, F13. The gate driving circuit GD2 as illustrated in FIG. 1 outputs the gate signal GS1 to the gate lines F21, F23, and the gate driving circuit GD2 as illustrated in FIG. 1 outputs the gate signal GS2 to the gate line F22.

The rise time of the gate signal GS2 is longer than the rise time of the gate signal GS1, and the fall time of the gate signal GS2 is longer than the fall time of the gate signal GS1. In this way, in the area of the display area AA1, the gate driving circuit GD1, GD2 output gate signal GS1, GS2 to the gate lines F11 to F13 and the gate lines F21 to F23 in an interlaced manner. In this way, the gate signals on the left and right sides of the display areas AA1 and AA2 may be the same. That is, regardless of the display area AA1 or AA2, the gate signals received on the left and right sides are gate signals GS1, GS2 in an interlaced manner.

In practice, the transistors G21 to G24 and G31 to G36 in FIG. 2 and FIG. 3 may be realized by a P-type low-temperature polycrystalline germanium film transistor, but the embodiments of the present disclosure are not limited thereto. For example, the transistors G21 to G24, G31 to G36 may also be realized with a P-type amorphous silicon thin film transistor. In some embodiments, an N-type thin film transistor may also be used, and the present disclosure does not limit the transistor type employed.

The embodiments of the present disclosure are to provide a display panel and a driving method. By compensating the unilateral driving circuit located at the display area of both sides of the driving opening, the unilateral driving waveform is approximated to the near-end and far-end interleaved waveform of the interleaved single-drive display area to avoid crossover phenomenon.

Although the present invention has been described in considerable detail with reference to certain embodiments thereof, other embodiments are possible. Therefore, the scope of the appended claims should not be limited to the description of the embodiments contained herein.

What is claimed is:

1. A display panel, comprising:
   a first display area;
   a second display area, comprising:
      an opening; and
      a first sub-display area and a second sub-display area, located at two sides of the opening;
   a first gate driving circuit and a second gate driving circuit, located at two sides of the first display area and the second display area;
   a plurality of first gate lines, located at the first sub-display area, wherein the plurality of first gate lines are coupled to the first gate driving circuit;
   a plurality of second gate lines, located at the second sub-display area, wherein the plurality of second gate lines are coupled to the second gate driving circuit; and
   a plurality of third gate lines, located at the first display area and are coupled to one of the first gate driving circuit and the second gate driving circuit, wherein the plurality of third gate lines receive a first gate signal from one of the first gate driving circuit and the second gate driving circuit;
   wherein the first gate driving circuit outputs the first gate signal and a second gate signal to the plurality of first gate lines in an interlaced manner;
   wherein the second gate driving circuit outputs the first gate signal and the second gate signal to the plurality of second gate lines in the interlaced manner;
   wherein a rise time of the second gate signal is longer than a rise time of the first gate signal, and a fall time of the second gate signal is longer than a fall time of the first gate signal;
   wherein the first gate driving circuit outputs the first gate signal to even-numbered gate lines of the plurality of first gate lines, and outputs the second gate signal to odd-numbered gate lines of the plurality of first gate lines, wherein the second gate driving circuit outputs the first gate signal to the odd-numbered gate lines of the plurality of first gate lines, and the second gate driving circuit outputs the second gate signal to the even-numbered gate lines of the plurality of first gate lines.

2. The display panel as claimed in claim 1, wherein the first gate driving circuit and the second gate driving circuit respectively comprises a plurality of first shift registers and a plurality of second shift registers, wherein the plurality of first shift registers respectively outputs the first gate signal, wherein the plurality of second shift registers respectively outputs the second gate signal, and the plurality of first shift registers and the plurality of second shift registers are arranged in the interlaced manner.

3. The display panel as claimed in claim 2, wherein the plurality of first shift registers respectively comprises a first driving transistor, the plurality of second shift registers respectively comprises a second driving transistor, and a width to length ratio of a channel of the first driving transistor is larger than a width to length ratio of a channel of the second driving transistor.

4. The display panel as claimed in claim 2, wherein the plurality of first shift registers respectively comprises a first driving transistor; wherein the plurality of second shift registers respectively comprises a compensation transistor and a second driving transistor, wherein the compensation transistor and the second driving transistor are connected in series, the compensation transistor is configured to transmit a subordinate signal to one of the plurality of first shift registers which is in a next stage, and the second driving transistor is configured to transmit the second gate signal.

5. The display panel as claimed in claim 4, wherein a width to length ratio of a channel of the first driving transistor is larger than a width to length ratio of a channel of the second driving transistor.

6. The display panel as claimed in claim 5, wherein the width to length ratio of the channel of the first driving transistor is equal to a sum of a width to length ratio of a channel of the compensation transistor and the width to length ratio of the channel of the second driving transistor.

7. The display panel as claimed in claim 2, wherein the first plurality of shift registers respectively comprises a first load, wherein the second plurality of shift registers respectively comprises a second load, and the second load is larger than the first load.

8. A driving method, suitable for a display panel, wherein the display panel comprises a first display area, a second display area, a first gate driving circuit and a second gate driving circuit, wherein the second display area comprises an opening:

outputting a first gate signal to a plurality of first gate lines located at the first display area by the first gate driving circuit;

outputting the first gate signal to a plurality of second gate lines located at the first display area by the second gate driving circuit, wherein the plurality of first gate lines and the plurality of second gate lines are arranged in an interlaced manner; and outputting the first gate signal and a second gate signal in the interlaced manner to a plurality of third gate lines located at the second display area by the first gate driving circuit and the second gate driving circuit;

wherein the first gate signal is outputted to even-numbered gate lines of the plurality of third gate lines, and the second gate signal is outputted to odd-numbered gate lines of the plurality of third gate lines, at one side of the second display area, by the first gate driving circuit;

wherein the first gate signal is outputted to odd-numbered gate lines of the plurality of third gate lines, and the second gate signal is outputted to even-numbered gate lines of the plurality of third gate lines, at the other side of the second display area, by the second gate driving circuit;

wherein a rise time of the second gate signal is longer than a rise time of the first gate signal, and a fall time of the second gate signal is longer than a fall time of the first gate signal.

\* \* \* \* \*